United States Patent [19]

Nakamura et al.

[11] Patent Number: 5,773,843

[45] Date of Patent: Jun. 30, 1998

[54] METAL ELECTRODE FOR SUPERCONDUCTING CURRENT PATH FORMED OF OXIDE SUPERCONDUCTOR MATERIAL AND SUPERCONDUCTING DEVICE UTILIZING THEREOF

[75] Inventors: Takao Nakamura; Michitomo Iiyama, both of Osaka, Japan

[73] Assignee: Sumitomo Electric Industries, Inc., Osaka, Japan

[21] Appl. No.: 605,554

[22] Filed: Feb. 20, 1996

[30] Foreign Application Priority Data

Feb. 20, 1995 [JP] Japan ................................. 7-055102

[51] Int. Cl.⁶ .................................................. H01L 29/06
[52] U.S. Cl. ............................... 257/30; 257/36; 257/39
[58] Field of Search .................................. 257/36, 39, 30

[56] References Cited

U.S. PATENT DOCUMENTS

| | | | |
|---|---|---|---|
| 5,098,656 | 3/1992 | Zimmerman et al. | 420/526 |
| 5,236,896 | 8/1993 | Nakamura et al. | 505/1 |
| 5,248,663 | 9/1993 | Noshiro et al. | |
| 5,278,136 | 1/1994 | Bednorz et al. | 505/1 |
| 5,407,903 | 4/1995 | Nakamura et al. | 505/193 |
| 5,422,336 | 6/1995 | Tsuda et al. | 505/193 |
| 5,430,011 | 7/1995 | Tanaka et al. | 505/193 |

FOREIGN PATENT DOCUMENTS

| | | |
|---|---|---|
| 0324044 | 7/1989 | European Pat. Off. . |
| 0406120 | 1/1991 | European Pat. Off. . |

OTHER PUBLICATIONS

Ghandhi, Sorab K., VLSI Fabrication Principles, John Wiley and Sons, New York, pp. 453–455, 1983.

*Primary Examiner*—Sara W. Crane
*Attorney, Agent, or Firm*—William L. Feeney; Kerkam, Stowell, Kondracki & Clarke, P.C.

[57] ABSTRACT

A metal electrode disposed on a surface of an oxide superconductor and forming electric contact with the oxide superconductor wherein at least a portion of the metal electrode is in contact with a side surface of the oxide superconductor which is perpendicular to the surface on which the metal electrode is disposed.

7 Claims, 4 Drawing Sheets

5 SUBSTRATE

50 BUFFER LAYER
5 SUBSTRATE

1 OXIDE SUPERCONDUCTOR FILM
50 BUFFER LAYER
5 SUBSTRATE

7 SrTiO$_3$ FILM
1 OXIDE SUPERCONDUCTOR FILM
50 BUFFER LAYER
5 SUBSTRATE

METAL ELECTRODE FOR SUPERCONDUCTING CURRENT PATH FORMED OF OXIDE SUPERCONDUCTOR MATERIAL AND SUPERCONDUCTING DEVICE UTILIZING THEREOF

BACKGROUND OF THE INVENTION

1. Field of the Invention

The present invention relates to a metal electrode for superconducting current path formed of an oxide superconductor material and a superconducting device utilizing the electrode. More specifically the present invention relates to a structure of a metal electrode which forms good ohmic contact with a superconducting current path an oxide superconductor material.

2. Description of Related Art

Devices which utilize superconducting phenomena operate rapidly with low power consumption so that they have higher performance than conventional semiconductor devices. Particularly, by using an oxide superconductor material which has been recently advanced in study, it is possible to produce a superconducting device which operates at relatively high temperature. However, at present, it is impossible to assemble a whole electric equipment with superconducting elementally devices only. Therefore, the superconducting device is invariably connected to a normal conducting device or a normal conducting current path.

When two different materials of different conductivities are electrically connected to each other, the current-voltage properties at their interface may be non-linear. This is often experienced when a metal electrode is formed on a semiconductor, which adversely affects on performances of semiconductor elements and semiconductor devices. Because, the oxide superconductor and the metal are more different in their conductivities than the semiconductor and the metal, problems of the current-voltage properties at an interface between the oxide superconductor and metal are prone to occur.

In addition, the oxide superconductor has anisotropic properties concerning its crystal orientations. For example, the oxide superconductor has the largest critical current density in the direction perpendicular to the c-axis of its crystal. By this, when the oxide superconductor is applied to various superconducting devices, superconducting elements, etc., they are configured such that current flows through the oxide superconductor in the direction in which the oxide superconductor has the largest critical current density, namely, in the direction perpendicular to the c-axis of the crystal of the oxide superconductor. This limits the arrangement of a metal electrode on the oxide superconductor. The metal electrode is not always arranged at a portion where current efficiently flows between the metal electrode and the oxide superconductor. In addition, the metal electrode does not always have a shape by which current efficiently flows between the metal electrode and the oxide superconductor.

If a metal electrode is formed on an oxide superconductor to flow current in the direction in which current is hard to flow, a substantial contact resistance between the metal electrode and the oxide superconductor increases. In addition, a surface of the oxide superconductor is unstable and a layer of high resistance is prone to be formed on the surface of the oxide superconductor. This layer of high resistance also increases the contact resistance between the metal electrode and the oxide superconductor. In order to compensate for the large contact resistance, the metal electrode must have a large area. This becomes an obstacle to reductions in the size of the superconducting device which are required in the case of application of the superconducting device to the electric equipment.

In order to eliminate the effect of the layer of high resistance, a metal electrode should be formed on the oxide superconductor in direct contact with the oxide superconductor. It requires specific techniques, for example, an in-situ deposition method in which a metal electrode of a metal film is successively deposited on an oxide superconductor film immediately after the oxide superconductor film is deposited without breaking the vacuum condition, a heat treatment conducted after a metal electrode of a metal film is deposited.

However, the contact resistance between a metal electrode of a silver (Ag) film and a $Y_1Ba_2Cu_3O_{7-x}$ oxide superconductor film is reduced to $10^{-8}$ $\Omega cm^2$ at the lowest even if the silver film is deposited on the $Y_1Ba_2Cu_3O_{7-x}$ oxide superconductor film by an in-situ deposition method. In case of a heat treatment conducted after a metal electrode of a silver film is deposited on a $Y_1Ba_2Cu_3O_{7-x}$ oxide superconductor film, the contact resistance between the metal electrode and the oxide superconductor film is reduced to $10_{-6}$ $\Omega cm^2$ at the lowest. In addition, if the heat treatment is effected, mutual diffusion occurs between the oxide superconductor and the adjacent other material, which spoils their properties, or oxygen in the oxide superconductor escapes so that its superconducting properties may be degraded.

As mentioned above, current cannot always flow from or to the conventional metal electrode applied to the superconducting devices or superconducting elements of the oxide superconductor through the oxide superconductor in the direction in which the oxide superconductor has a larger current capability. In addition, a layer of high resistance may be formed between the metal electrode and the oxide superconductor due to the instability of a surface of the oxide superconductor. A heat treatment to eliminate the effect of the layer of high resistance and an etching to remove the layer of high resistance may degrade the oxide superconductor. By all of these, the contact resistance between the metal electrode and the oxide superconductor is increased, so that the size of the metal electrode should be enlarged to compensate for the large contact resistance.

This causes difficulty in forming a metal electrode on a thin oxide superconductor film, which makes it almost impossible to thin each layer of a superconducting device in order to provide a faster speed or low consumption. In addition, the size of a superconducting device cannot be reduced due to the metal electrode having the enlarged size. Furthermore, the metal electrode should be sometimes disposed a large distance apart from the active portion of the superconducting device, so that a parasitic capacitance is generated so as to degrade properties of the superconducting device.

SUMMARY OF THE INVENTION

Accordingly, it is an object of the present invention to provide a metal electrode of novel structure for superconducting devices and elements, which have overcome the above mentioned defects of the conventional ones.

Another object of the present invention to provide a superconducting field effect transistor type device (abbreviated to super-FET hereinafter) comprising the above metal electrode.

Still another object of the present invention to provide a method for manufacturing the above metal electrode.

The above and other objects of the present invention are achieved in accordance with the present invention by a metal electrode disposed on a surface of an oxide superconductor and forming electric contact with the oxide superconductor wherein at least a portion of the metal electrode is in contact with a side surface of the oxide superconductor which is perpendicular to the surface on which the metal electrode is disposed.

The metal electrode according to the present invention is effective when it is formed on a c-axis orientated [(001) orientated] oxide superconductor film in which the c-axis of the crystal of the oxide superconductor is perpendicular to the film plane. The oxide superconductor has the largest critical current density in the direction perpendicular to the c-axis of its crystal and tends to prevent current from flowing in the direction parallel to the c-axis of its crystal. Therefore, the c-axis orientated oxide superconductor has larger current capability in the direction parallel to its film plane and tends to prevent current from flowing in the direction perpendicular to its film plane.

The metal electrode according to the present invention contacts with both of a surface and a side surface perpendicular to the surface of the oxide superconductor. By this, the metal electrode according to the present invention can supply large current to the oxide superconductor through its surface and side surface, even the oxide superconductor is formed of a c-axis orientated oxide superconductor thin film.

The metal electrode can be formed of any metal and alloy so long as it does not have adverse effect on the oxide superconductor. In this point of view, the metal electrode is preferably formed of, for example, Au, Ag, Pt or an alloy including at least one of them.

In one preferred embodiment of the present invention, the metal electrode comprises a layer of an ohmic alloy between the oxide superconductor and itself. This layer of the ohmic alloy improves conditions of electrical contact or electrical connection between the metal and the oxide superconductor so that current flows between the metal electrode and the oxide superconductor with linear current-voltage properties. The ohmic alloy consists of the oxide superconductor and the metal of electrode and has a gradient composition in which the content of the metal of electrode is gradually reduced toward the inside of the oxide superconductor.

The layer of the ohmic alloy preferably has a thickness equal to or less than the height of the side surface of the oxide superconductor which the metal electrode contacts with.

According to the another aspect of the present invention, there is provided a field effect transistor type superconducting device;

comprising:

a substrate having a principal surface;

a thin superconducting channel formed of an oxide superconductor over the principal surface of the substrate;

a source electrode and a drain electrode disposed at the both ends of the superconducting channel in contact with the superconducting channel, so that superconducting current can flow through the superconducting channel between the source electrode and the drain electrode; and a gate electrode on a gate insulator disposed on the superconducting channel for controlling the superconducting current flowing through the superconducting channel by a signal voltage applied to the gate electrode;

wherein at least a portion of each of the source electrode and the drain electrode is in contact with a side surface of the superconducting channel which is perpendicular to the principal surface of the substrate.

The superconducting channel of the superconducting field effect transistor type device should have a thickness of 5 nanometers or less in order to perform a complete ON/OFF function by a signal voltage of a few volts applied to the gate electrode. For large current capability of the device, the superconducting channel is usually formed of a c-axis orientated oxide superconductor thin film. In addition, the superconducting field effect transistor type device should have a source electrode and a drain electrode which supply current flowing through the superconducting channel. It is very difficult to form the source and drain electrodes directly on such an extremely thin superconducting channel.

By this, in a prior art, a superconducting source region and a superconducting drain region having a thickness of a few hundreds nanometers are formed at each end of the superconducting channel on which the source and drain electrodes are disposed. This arrangement causes parasitic capacitance due to the larger distance between the source electrode and the superconducting channel and between the drain electrode and the superconducting channel, which reduces the performance of the device.

By forming the source and drain electrodes in accordance with the present invention, they can be disposed directly at each end of the superconducting channel in direct contact with it, which improves the performance of the device.

According to still another aspect of the invention, there is provided a method for forming a metal electrode on an oxide superconductor with electric contact comprising steps of:

etching a surface of the oxide superconductor to expose a side surface perpendicular to the surface;

forming a metal layer such that at least a portion of the metal layer is in contact with the newly exposed side surface of the oxide superconductor; and locally heating the metal layer.

In one embodiment of the present invention, the heating process of the metal layer is conducted so that a layer of an ohmic alloy is formed between the metal layer and the oxide superconductor.

The heating process of the metal layer is preferably conducted by using laser. The position and the extent of the heating are accurately determined so that unnecessary heating which causes unnecessary mutual diffusion between the oxide superconductor and adjacent another material or escape of oxygen from the oxide superconductor, which degrade the properties of the oxide superconductor, can be prevented. In this connection, the heating process is preferably conducted so that the layer of the ohmic alloy is formed so as to have a thickness equal to or less than a height of the newly exposed side surface, namely a distance between the surface and the etched bottom, of the oxide superconductor.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1E, a process for manufacturing the metal electrode in accordance with the present invention will be described.

Figure 1A:
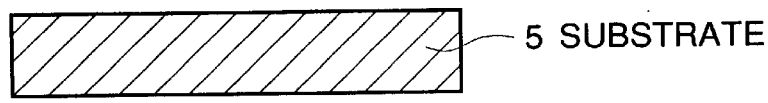
FIGS. 1A to 1E are diagrammatic sectional views for illustrating an embodiment of the process for manufacturing the metal electrode in accordance with the present invention.
Figure 1B:
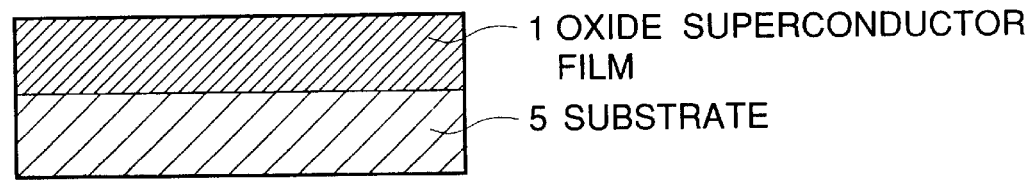

At first, a $SrTiO_3$ (100) single crystalline substrate 5 as shown in FIG. 1A was heated at a temperature of 950° C. for one hour in $O_2$ to eliminate contaminants on its surface and crystal defects. Then, a c-axis orientated $Y_1Ba_2Cu_3O_{7-x}$ oxide superconductor film 1 having a thickness of 100 nanometers was deposited by a laser deposition method, as shown in FIG. 1B. A condition of forming the $Y_1Ba_2Cu_3O_{7-x}$ oxide superconductor film 1 by a laser deposition method was as follows:

| | |
|---|---|
| Substrate temperature | 700° C. |
| Pressure | $O_2$: 39.99 Pa (300 mTorr) |
| Target | $Y_1Ba_2Cu_3O_{7-x}$ sinter |
| Energy density | 1 Joule/cm$^2$ |
| Beam diameter | 1 mm$\phi$ |
| Deposition rate | 10 nanometers/min. |
| Film thickness | 100 nanometers |

Figure 1C:
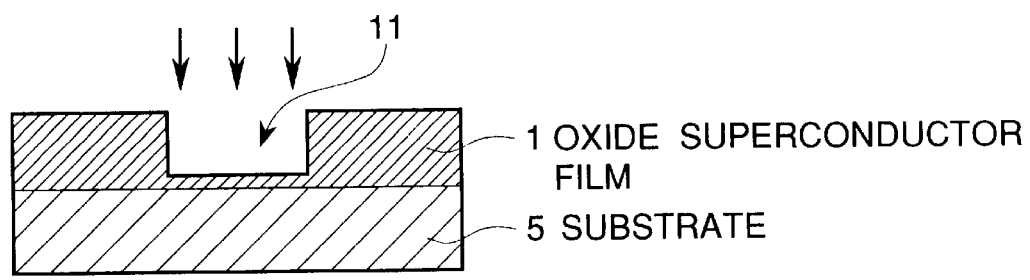

The critical temperature of the obtained $Y_1Ba_2Cu_3O_{7-}$ oxide superconductor film 1 was on the order of 88–90K. Thereafter, a center. portion of the oxide superconductor film 1 at which a metal electrode was to be formed was etched by a focused ion beam etching so as to form a hollow 11, as shown in FIG. 1C. In this etching process, liquid metal gallium (Ga) was used for the ion source, the acceleration voltage of the ions was 50 kV, and the dose was $10^{18}$/cm$^3$. The hollow 11 had a depth of on the order of 80 nanometers.

Figure 1D:
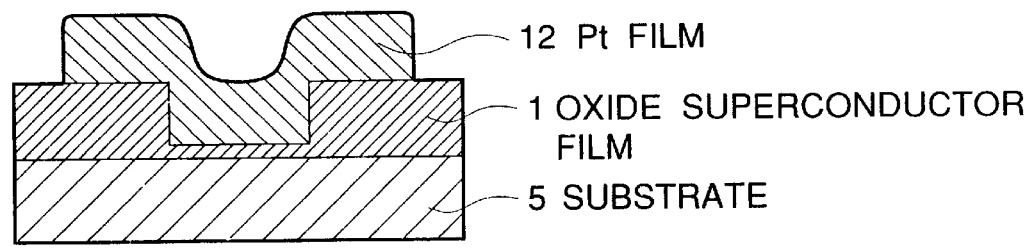

Successively, a platinum (Pt) film 12 was deposited on the hollow 11 of the oxide superconductor film 1 by an in-situ electron beam deposition without breaking the vacuum, as shown in FIG. 1D. The platinum film 12 was deposited to a thickness of 150 nanometers.

This platinum film 12 is to be a metal electrode and is preferably formed by an in-situ process following to the etching process for exposing the side surface of the oxide superconductor without breaking vacuum in order to prevent contamination and degradation of the newly exposed side surface of the oxide superconductor. Because, the newly exposed side surface of the oxide superconductor is unstable and is prone to be contaminated and degraded.

Figure 1E:
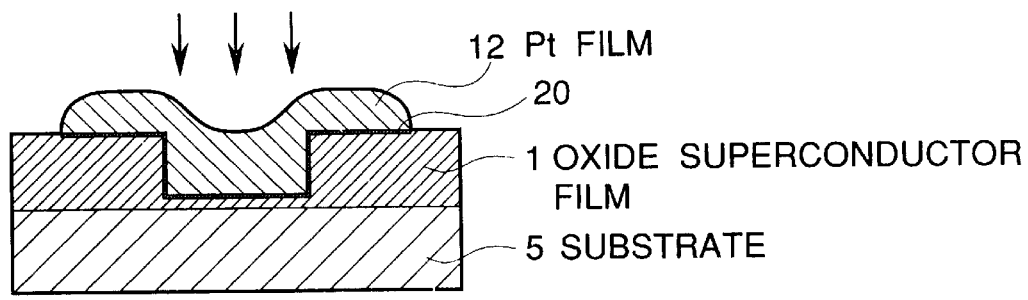

Finally, the platinum film 12 was locally heated by laser to form an ohmic alloy layer 20 having a thickness of 60 nanometers between the oxide superconductor film 1 and the platinum film 12. The ohmic alloy layer 20 was formed of an alloy consisting platinum and $Y_1Ba_2Cu_3O_{7-x}$ oxide in which the content of platinum was gradually reduced toward the inside of $Y_1Ba_2Cu_3O_{7-x}$ oxide superconductor. The thickness of the ohmic alloy layer 20 was preferably larger than a depth to which the gallium ions were implanted and remained in the etching process. By this, the metal electrode in accordance with the present invention was completed, as shown in FIG. 1E. The energy density of the laser for heating the platinum film 12 was 10 milli-Joule/cm$^2$.

The contact resistance between the above platinum electrode 12 and the oxide superconductor film 1 was $10^{-9}$ $\Omega$cm$^2$ or lower. The current-voltage properties had the same straight line relationship whenever current flew from the platinum electrode 12 to the oxide superconductor film 1, and vice versa, so that it became clear that a favorable ohmic contact was formed between the platinum electrode 12 and the oxide superconductor film 1.

A superconducting field effect transistor type device (abbreviated as super-FET hereinafter) comprising a source electrode and a drain electrode in accordance with the present invention was manufactured.

Referring to FIGS. 2A to 2I, the process will be described.

Figure 2A:
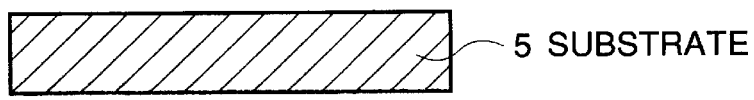
FIGS. 2A to 2I are diagrammatic sectional views for illustrating an embodiment of the process for manufacturing the super-FET in accordance with the present invention.
Figure 2B:
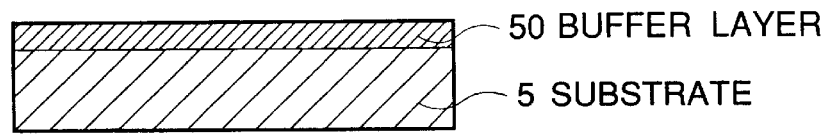

On a $SrTiO_3$ (100) single crystalline substrate 5 as shown in FIG. 2A, a $Pr_1Ba_2Cu_3O_{7-y}$ oxide buffer layer 50 was deposited by a reactive co-evaporation, as shown in FIG. 2B. A condition of forming the $Pr_1Ba_2Cu_3O_{7-y}$ oxide buffer layer 50 by a reactive co-evaporation was as follows:

| | |
|---|---|
| Substrate temperature | 700° C. |
| Pressure | 3.999 × 10$^{-3}$ Pa |
| | [3 × 10$^{-5}$ Torr (near the substrate)] |
| | ($O_2$ including 70 vol. % $O_3$ or more) |
| Evaporation source | Pr: 1220° C. |
| and its crucible temperature | Ba: 620° C. |
| | Cu: 1000° C. |
| Film thickness | 15 nanometers |

The buffer layer 50 can be formed of $(Ba_zSr_{1-z})TiO_3$ and preferably has a thickness of 15 to 20 nanometers to prevent mutual diffusion between the substrate 5 and an oxide superconductor thin film to be deposited.

Figure 2C:
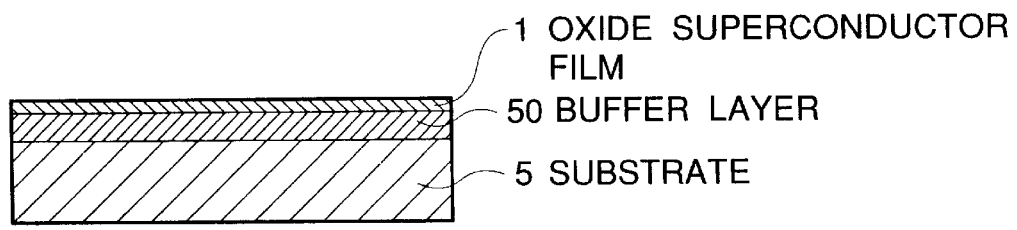

Then, switching the praseodymium (Pr) evaporation source to an yttrium (Y) evaporation source, a c-axis orientated [(001) orientated] $Y_1Ba_2Cu_3O_{7-x}$ oxide superconductor thin film 1 having a thickness of 5 nanometers was successively deposited on the buffer layer 50 by an in-situ reactive co-evaporation, as shown in FIG. 2C. The $Y_1Ba_2Cu_3O_{7-x}$ oxide superconductor thin film 1 was grown so as to have a thickness of 3–10 nanometers which was suitable for a superconducting channel of a super-FET. A condition of forming the $Y_1Ba_2Cu_3O_{7-x}$ oxide superconductor thin film 1 by a reactive co-evaporation was as follows:

| | |
|---|---|
| Substrate temperature | 700° C. |
| Pressure | 3.999 × 10$^{-3}$ Pa |
| | [3 × 10$^{-5}$ Torr (near the substrate)] |
| | ($O_2$ including 70 vol. % $O_3$ or more) |
| Evaporation source | Y: 1220° C. |
| and its crucible temperature | Ba: 620° C. |
| | Cu: 1000° C. |

Figure 2D:
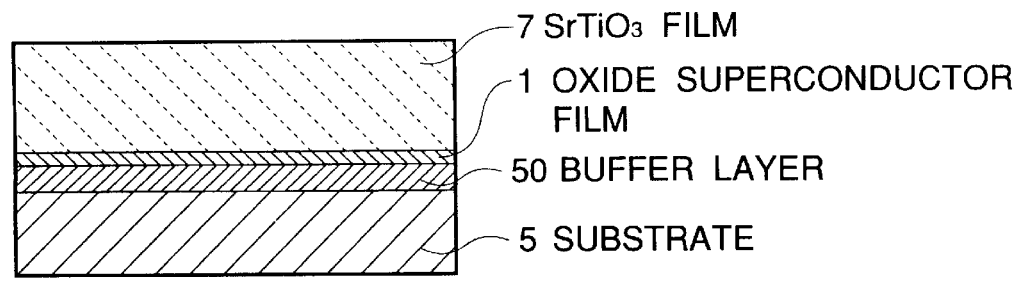

Thereafter, as shown in FIG. 2D, a $SrTiO_3$ film 7 was successively formed on the $Y_1Ba_2Cu_3O_{7-x}$ oxide superconductor thin film 1 by an in-situ reactive co-evaporation to a thickness of 250 nanometers. A condition of the reactive co-evaporation was as follows:

| | |
|---|---|
| Substrate temperature | 530° C. |
| Pressure | 3.999 × 10$^{-3}$ Pa |
| | [3 × 10$^{-5}$ Torr (near tbe substrate)] |
| | ($O_2$ including 70 vol. % $O_3$ or more) |
| Evaporation source | Sr: 600° C. |
| and its crucible temperature | Ti: 1500° C. |

Figure 2E:
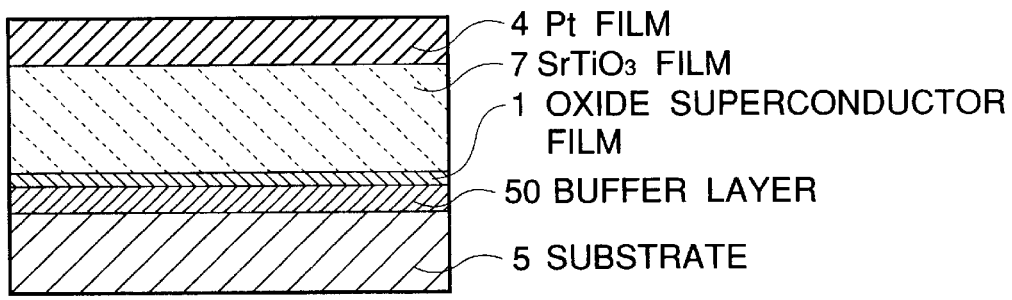
Figure 2F:
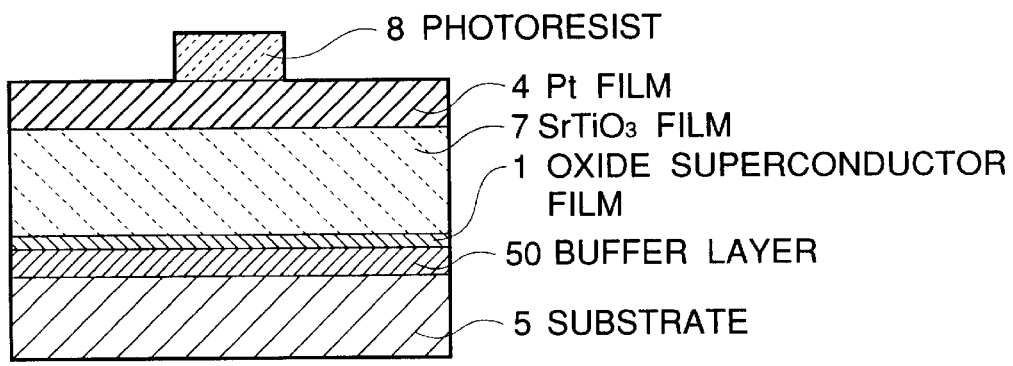
Figure 2G:
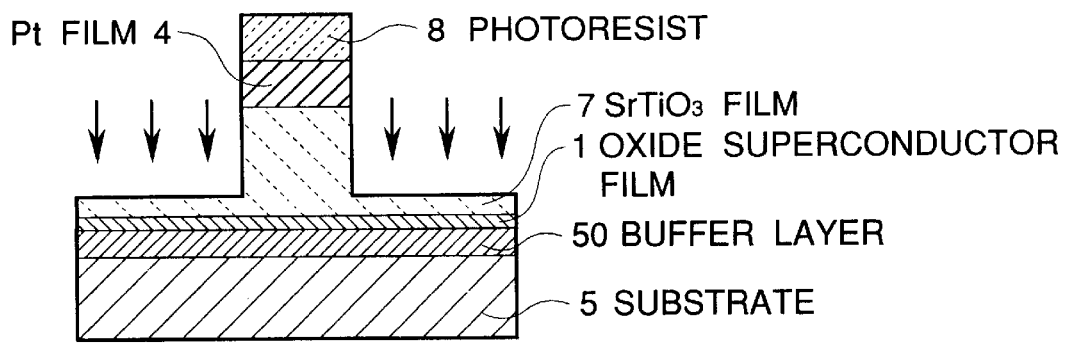

Additionally, a platinum film 4 was successively formed on the $SrTiO_3$ film 7 by an in-situ electron beam evaporation to a thickness of 100 nanometers, as shown in FIG. 2E. Then, a photoresist 8 was formed at a center portion of the platinum film 4, as shown in FIG. 2F. The platinum film 4 and the $SrTiO_3$ film 7 were etched by an ion milling using Ar ions with using the photoresist 8 as a mask, as shown in FIG. 2G. The ion milling was conducted with an acceleration voltage of 600 V and an ion current of 150 mA so that an etched portion of the $SrTiO_3$ film 7 had a thickness of 20 nanometers or less. The remained platinum film 4 was to be a part of a gate electrode and the portion of the $SrTiO_3$ film 7 under the remained platinum film 4 became a gate insulator.

Furthermore, A portion of the $Y_1Ba_2Cu_3O_{7-x}$ oxide superconductor film I under the gate insulator became a superconducting channel. The gate insulator can be formed of MgO, $Si_3N_4$ or $Ba_xSr_{-x}TiO_3$ (0<x<1).

Figure 2H:
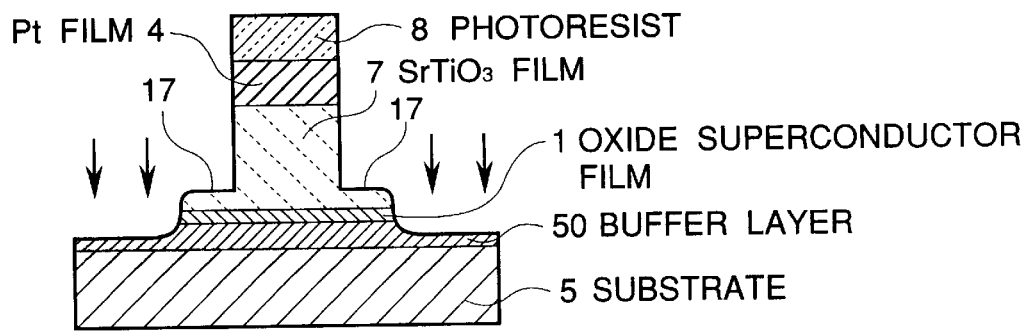

Thereafter, thin portions of the $SrTiO_3$ film and the buffer layer 50 were etched to a half depth of the buffer layer 50 so that thin portions 17 of the $SrTiO_3$ film having a length of on the order of 0.1 $\mu$m remained at the both side of the gate insulator so as to expose side surfaces of the oxide superconductor film 1, as shown in FIG. 2H. The newly exposed side surfaces of the oxide superconductor film 1 were parallel to the c-axis of its crystal and the oxide superconductor film 1 had a large current capability in the direction perpendicular to them. In this etching process, liquid metal gallium (Ga) was used for the ion source, the acceleration voltage of the ions was 50 kV, and the dose was $10^{18}/cm^3$.

Figure 2I:
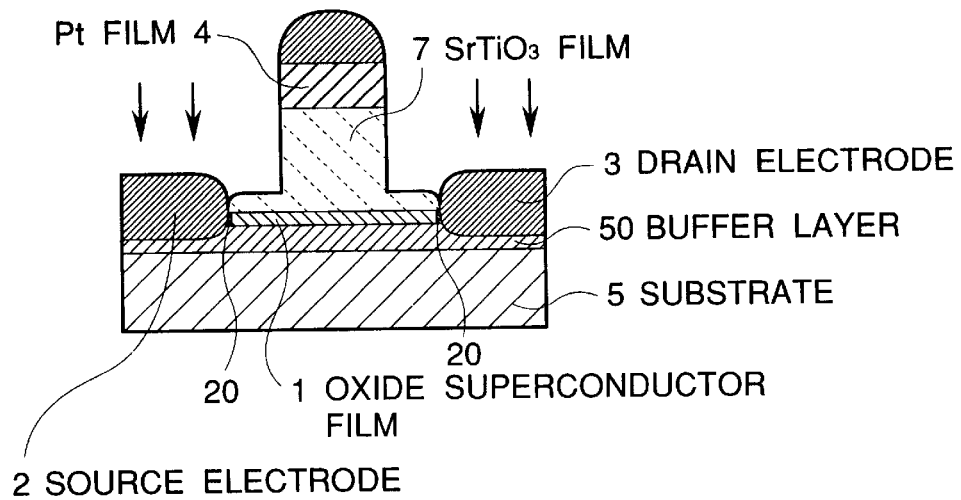

Finally, as shown in FIG. 2I, platinum films were successively deposited by an in-situ electron beam deposition in contact with the side surfaces of the oxide superconductor film 1 and the deposited platinum films were locally heated by laser to form ohmic alloy layers 20 having a thickness of 3 nanometers, which was larger than the depth to which the gallium ions were implanted and remained in the etching process, between the platinum films and the oxide superconductor film 1 so that a source electrode 2 and drain electrode 3 were formed. The ohmic alloy layers 20 were formed of an alloy consisting platinum and $Y_1Ba_2Cu_3O_{7-x}$ oxide in which the content of platinum was gradually reduced toward the inside of $Y_1Ba_2Cu_3O_{7-x}$ oxide superconductor. A platinum film deposited on the platinum film 4 formed a gate electrode. By this, the super-FET in accordance with the present invention was completed.

In the above process, the source electrode 2 and drain electrode 3 were separated from the gate electrode by surface tension of molten platinum at the local heating. However, they can be separated by an appropriate etching. It is also preferable that the $SrTiO_3$ film 7 is etched obliquely so as to form a gate electrode having a "T"-shape section to separate the source electrode 2 and drain electrode 3 from the gate electrode.

Properties of the super-FET in accordance with the present invention manufactured as mentioned above were measured so that it became clear that the super-FET had ideal current-voltage properties between its source and drain, which revealed a fact that favorable ohmic contacts were formed between the superconducting channel of the oxide superconductor thin film 1 and the source electrode 2 and between the superconducting channel of the oxide superconductor thin film 1 and the drain electrode 3.

As described above, according to the present invention, a metal electrode of novel structure suitable for superconducting devices or superconducting elements utilizing oxide superconductors is provided.

The metal electrode according to the present invention substantially has a smaller contact resistance so that large current can pass through even it has a small contact area, because it contacts with the oxide superconductor suitable for current flowing in the direction in which the oxide superconductor has the largest current capability. In addition, the metal electrode according to the present invention has favorable contact conditions so that current-voltage properties become symmetry, By applying the metal electrode according to the present invention to the source and drain electrodes of the super-FET utilizing the oxide superconductor, the source and drain electrodes can be directly joined to the thin superconducting channel of the oxide superconductor, which significantly shorten distances from the source and drain electrodes to the gate. This contributes not only the reduction of the size of the super-FET but also reduction of parasitic capacitance so as to improve performance of the super-FET.

In the above mentioned embodiments, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting field effect transistor type device comprising:

a substrate having a principal surface;

a thin superconducting channel formed of an oxide superconductor over the principal surface of the substrate;

a metal source electrode disposed at a first end of the superconducting channel and a metal drain electrode disposed at a second end of the superconducting channel said source electrode and said drain electrode being electrically coupled to the superconducting channel, so that superconducting current can flow through the superconducting channel between the source electrode and the drain electrode; and a gate electrode on a gate insulator disposed on the superconducting channel for controlling the superconducting current flowing through the superconducting channel by a signal voltage applied to the gate electrode;

wherein at least a portion of each of the source electrode and the drain electrode is in electrical contact with a side surface of the superconducting channel which is perpendicular to the principal surface of the substrate and wherein layers of a ohmic alloy, comprising a metal of the same type as used for said source electrode and said drain electrode and an oxide superconductor of the same type as used for said superconducting channel, are disposed between the source electrode and the superconducting channel and between the drain electrode and the superconducting channel.

2. A superconducting device as claimed in claim 1; wherein the superconducting channel is formed of a c-axis orientated oxide superconductor thin film.

3. A device as claimed in claim 1, wherein the source electrode and the drain electrode are formed of a metal selected from the group consisting of Au, Ag, Pt and an alloy containing at least one of Au, Ag, and Pt.

4. A device as claimed in claim 1, wherein the ohmic alloy layers have a gradient composition in which the content of the metal is gradually reduced toward the superconducting channel.

5. A device as claimed in claim 1, wherein the layers of the ohmic alloy have a thickness less than or equal to the height of the side surface of the superconducting channel.

6. A device as claimed in claim 1, wherein the oxide superconductor is formed of a high-$T_c$ copper-oxide type compound superconductor.

7. A device as claimed in claim 6, wherein the oxide superconductor is formed of an oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

* * * * *